(12) United States Patent
Akamatsu

(10) Patent No.: US 7,964,917 B2
(45) Date of Patent: Jun. 21, 2011

(54) SEMICONDUCTOR DEVICE INCLUDING LINER INSULATING FILM

(75) Inventor: Susumu Akamatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 11/907,862

(22) Filed: Oct. 18, 2007

(65) Prior Publication Data

US 2008/0173954 A1   Jul. 24, 2008

(30) Foreign Application Priority Data

Jan. 24, 2007   (JP) ................. 2007-013747

(51) Int. Cl.
*H01L 21/70* (2006.01)

(52) U.S. Cl. ........ 257/369; 257/270; 257/392; 257/632; 257/638; 257/900; 257/E21.626; 257/E21.632; 257/E21.64; 257/E27.061; 438/981

(58) Field of Classification Search ........... 257/E21.626, 257/E21.64, 900, 270, 369, 392, 638, 632, 257/E27.061, E21.632; 438/981; 437/42, 437/978

See application file for complete search history.

(56) References Cited

U.S. PATENT DOCUMENTS

| | | | |
|---|---|---|---|
| 2004/0135234 A1* | 7/2004 | Morin et al. | 257/635 |
| 2004/0217448 A1* | 11/2004 | Kumagai et al. | 257/627 |
| 2005/0093030 A1* | 5/2005 | Doris et al. | 257/288 |
| 2007/0090465 A1* | 4/2007 | Suzuki et al. | 257/369 |
| 2007/0122966 A1* | 5/2007 | Hoentschel et al. | 438/231 |

OTHER PUBLICATIONS

Ito, S., et al., "Mechanical Stress Effect of Etch-Stop Nitride and its Impact on Deep Submicron Transistor Design," 0-7803-6441-4/00, 2000, IEEE.

* cited by examiner

*Primary Examiner* — Matthew E Warren
*Assistant Examiner* — David Z Chen
(74) *Attorney, Agent, or Firm* — McDermott Will & Emery LLP

(57) ABSTRACT

A semiconductor device includes a plurality of first MIS transistors and a plurality of second MIS transistors formed on a semiconductor substrate and a liner insulating film applying stress along the gate length direction. Each of the first MIS transistors includes first L-shaped sidewalls each having an L-shaped cross-sectional shape, and each of the second MIS transistors includes second L-shaped sidewalls each having an L-shaped cross-sectional shape and outer sidewalls. The minimum thickness of a part of the liner insulating film located on each of second source/drain regions of the second MIS transistor is larger than the minimum thickness of a part thereof located on each of first source/drain regions of the first MIS transistor.

18 Claims, 5 Drawing Sheets

SEMICONDUCTOR DEVICE INCLUDING LINER INSULATING FILM

CROSS-REFERENCE TO RELATED APPLICATIONS

The disclosure of Japanese Patent Application No. 2007-013747 filed on Jan. 24, 2007 including specification, drawings and claims is incorporated herein by reference in its entirety.

BACKGROUND OF THE INVENTION (1) Field of the Invention

The present invention relates to semiconductor devices and methods for fabricating the same, and more particularly relates to a semiconductor device including MIS transistors of different conductivity types.

(2) Description of Related Art

In recent years, with increases in the degree of integration, functionality and speed of semiconductor integrated circuit devices, miniaturization of transistors has been advanced. A so-called scaling law in which the current driving forces of transistors are improved with advances in miniaturization of transistors has been conventionally effective. Meanwhile, in order to achieve reduction in energy consumption and the long-time use of mobile devices, further miniaturization of transistors and reduction in power consumption have been demanded. In such a field, decreases in the sizes of transistors do not lead to improvement in the driving forces of transistors.

In order to improve the driving force of a transistor, a measure in which a gate insulating film is reduced in thickness is considered. However, a problem that a reduction of the thickness of a gate insulating film causes gate leakage current to increase occurs. To cope with this, a technique has been suggested in which the driving force of a transistor is improved by applying stress to a channel region of the transistor (see, for example, S. Ito, et al., "IEDM 2000", 2000, p. 247).

FIG. 6 illustrates a cross-sectional structure of a known transistor having a structure in which stress is applied to a channel region of the transistor. As illustrated in FIG. 6, a gate electrode 204 is formed on a substrate 201 with a gate insulating film 203 interposed therebetween, L-shaped first sidewalls 206 are formed on both lateral sides of the gate electrode 204, and second sidewalls 207 are formed on both lateral sides of the gate electrode 204 with the first sidewalls 206 interposed therebetween. A liner insulating film 209 is formed to cover the gate electrode 204 and the second sidewalls 207. The liner insulating film 209 represents a film having tensile stress. With the above-described structure, stress can be applied to the channel region under the gate electrode 204, resulting in the driving force of the transistor improved.

However, for the known semiconductor device, stress arising from the liner insulating film 209 is not sufficiently transferred to the channel region, and thus the driving force of the transistor cannot be sufficiently improved.

Furthermore, a memory unit or any other unit requires both a P-channel transistor and an N-channel transistor. Meanwhile, the orientation of stress needed to improve the driving force of a P-channel transistor is different from that of stress needed to improve the driving force of an N-channel transistor. In view of the above, if a liner insulating film having tensile stress were formed to improve the driving force of an N-channel transistor, the driving force of a P-channel transistor would be reduced. In order to avoid the reduction in the driving force of the P-channel transistor, the step of removing a part of the liner insulating film located on a region of the substrate on which the P-channel transistor is to be formed (hereinafter, referred to as "P-channel transistor formation region), the step of forming a mask to prevent the formation of a liner insulating film on the P-channel transistor formation region, or any other step is needed.

SUMMARY OF THE INVENTION

The present invention is made to solve the above-mentioned known problems, and its object is to allow stress from a liner insulating film to be sufficiently transferred to a channel region and provide a semiconductor device which includes transistors of different conductivity types and in which the need for the step of removing a liner insulating film is eliminated.

In order to achieve the above-described object, a semiconductor device of the present invention is configured such that first MIS transistors each do not have outer sidewalls and second MIS transistors each have outer sidewalls.

More specifically, a semiconductor device of the present invention includes a first MIS transistor and a second MIS transistor both formed on a semiconductor substrate, and a liner insulating film covering the first MIS transistor and the second MIS transistor and applying stress to a channel region of the first MIS transistor along the gate length direction of the first gate electrode. The first MIS transistor includes: a first gate insulating film formed on a first area of the semiconductor substrate; a first gate electrode formed on the first gate insulating film; first L-shaped sidewalls covering both sides of the first gate electrode and part of the semiconductor substrate to each have an L-shaped cross-sectional shape; and first source/drain regions formed on both sides of a part of the first area covered with the first gate electrode and the first L-shaped sidewalls. The second MIS transistor includes: a second gate insulating film formed on a second area of the semiconductor substrate; a second gate electrode formed on the second gate insulating film; second L-shaped sidewalls covering both sides of the first gate electrode and part of the semiconductor substrate to each have an L-shaped cross-sectional shape; outer sidewalls formed on the second L-shaped sidewalls; and second source/drain regions formed on both sides of a part of the second area covered with the second gate electrode, the second L-shaped sidewalls and the outer sidewalls. No outer sidewall is formed on the first L-shaped sidewalls, and the minimum thickness of a part of the liner insulating film located on each of the second source/drain regions is larger than the minimum thickness of a part of the liner insulating film located on each of the first source/drain regions.

According to the semiconductor device of the present invention, no outer sidewall is formed on the first L-shaped sidewalls. This allows a channel region of the first MIS transistor to become closer to the liner insulating film. Therefore, stress can be efficiently applied to the channel region of the first MIS transistor. This allows stress to be more efficiently applied to the first MIS transistor than to the second MIS transistor under conditions that the first and second MIS transistors are covered with the same liner insulating film. As a result, in a semiconductor device in which MIS transistors of different conductivity types coexist, when the driving force of one of the MIS transistors has been improved, the driving force of the other MIS transistor can be prevented from being reduced.

A fabrication method for a semiconductor device of the present invention is directed toward a method for fabricating a semiconductor device comprising a first MIS transistor formed on a first area of a semiconductor substrate and a second MIS transistor formed on a second area of the semiconductor substrate. The method includes the steps of: (a) forming a first gate insulating film and a first gate electrode on the first area and forming a second gate insulating film and a second gate electrode on the second area; (b) forming first sidewalls and second sidewalls in the order away from the first gate electrode to cover both sides of the first gate electrode and forming third sidewalls and fourth sidewalls in the order away from the second gate electrode to cover both sides of the second gate electrode; (c) forming first source/drain regions on both sides of a part of the first area covered with the first gate electrode, the first sidewalls and the second sidewalls; (d) forming second source/drain regions on both sides of a part of the second area covered with the second gate electrode, the third sidewalls and the fourth sidewalls; (e) after the steps (c) and (d), removing the second sidewalls; and (f) after the step (e), forming a liner insulating film to cover the first gate electrode, the first sidewalls, the first source/drain regions, the second gate electrode, the third sidewalls, the fourth sidewalls, and the second source/drain regions, the liner insulating film applying stress to a channel region of the first MIS transistor along the gate length direction of the first gate electrode. In the step (f), the liner insulating film is formed such that the minimum thickness of a part of the liner insulating film located on each of the second source/drain regions becomes larger than the minimum thickness of a part of the liner insulating film located on each of the first source/drain regions.

According to the method of the present invention, stress from the liner insulating film is hardly applied to a channel region of the second MIS transistor. Meanwhile, stress from the liner insulating film is efficiently applied to a channel region of the first MIS transistor. In view of the above, the method of the present invention allows stress from the liner insulating film to be sufficiently transferred to a channel region, and the present invention can provide a semiconductor device which includes transistors of different conductivity types and in which the need for the step of removing a liner insulating film is eliminated.

BRIEF DESCRIPTION OF THE DRAWINGS

FIGS. 1A and 1B illustrate a semiconductor device according to a first embodiment of the present invention, in which FIG. 1A is a plan view of the semiconductor device and FIG. 1B is a cross-sectional view taken along the line Ib-Ib in FIG. 1A.

DETAILED DESCRIPTION OF THE INVENTION

Embodiment 1

Figure 1A:
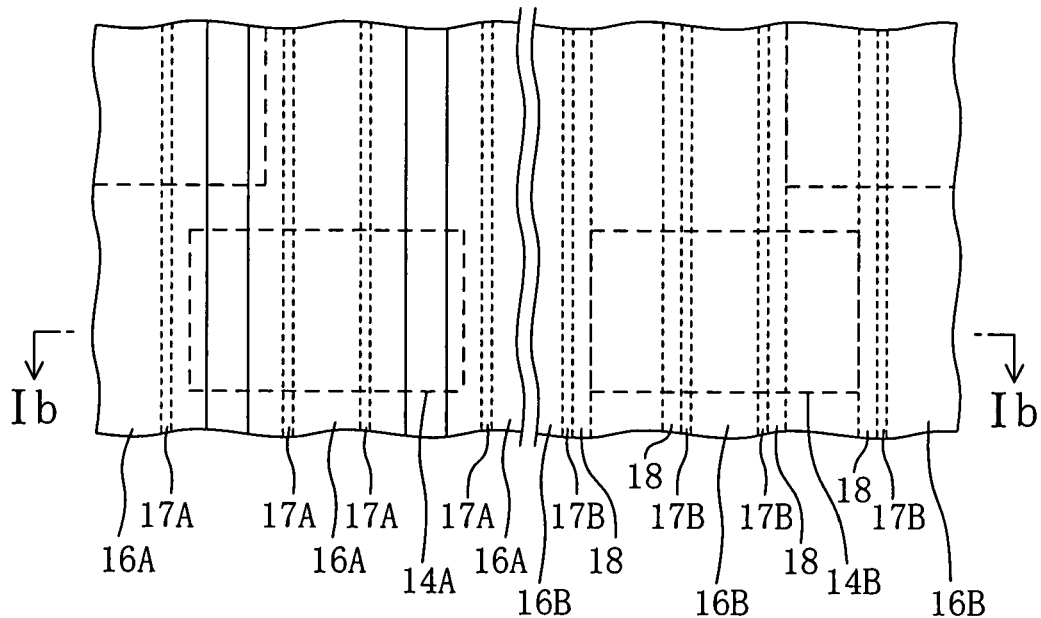
Figure 1B:
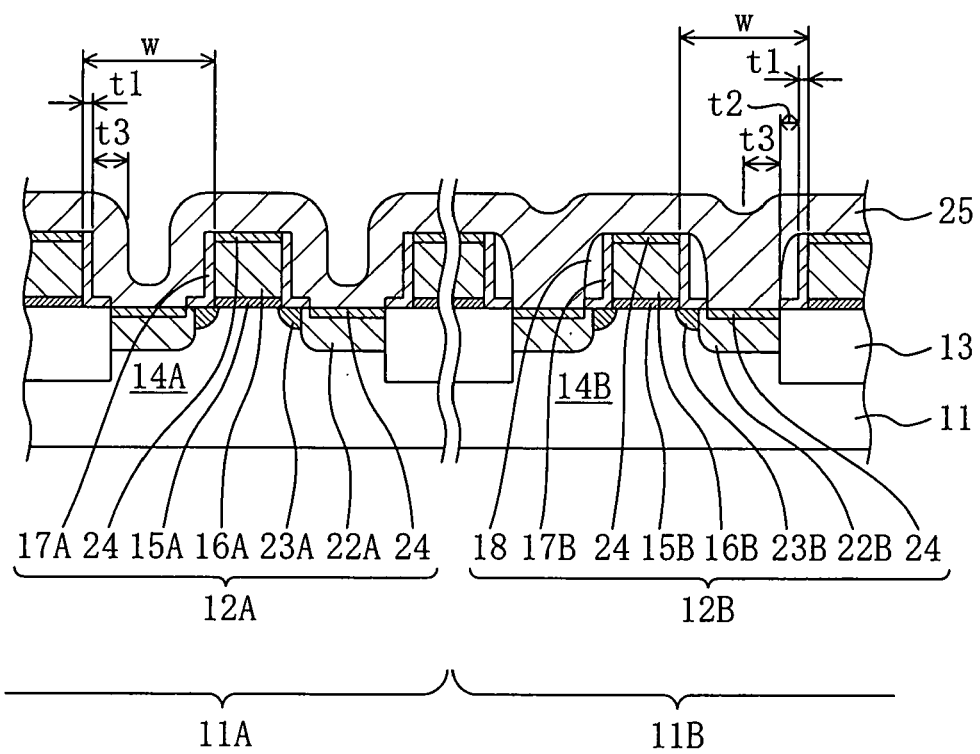

A first embodiment of the present invention will be described with reference to the drawings. FIGS. 1A and 1B illustrate a semiconductor device according to the first embodiment, in which FIG. 1A illustrates a plan structure of the semiconductor device and FIG. 1B illustrates a cross-sectional structure thereof taken along the line Ib-Ib in FIG. 1A. As illustrated in FIGS. 1A and 1B, a first MIS (metal-insulator semiconductor) transistor 12A serving as an N-channel (N-type) transistor is formed on a first area 11A of a semiconductor substrate 11 made of silicon (Si), and a second MIS transistor 12B serving as a P-channel (P-type) transistor is formed on a second area 11B thereof.

The first MIS transistor 12A is formed on a first active region 14A of the first area 11A isolated by a part of an isolation region 13 in the first area 11A. A first gate electrode 16A is formed on the first active region 14A with a first gate insulating film 15A interposed therebetween. First L-shaped sidewalls 17A are formed to cover both lateral sides of the first gate electrode 16A and parts of the top surface of the semiconductor substrate 11 and each have an L-shaped cross-sectional shape.

N-type first source/drain regions 22A are formed in parts of the first active region 14A located on both lateral sides of a part thereof covered with the first gate electrode 16A and the first L-shaped sidewalls 17A. N-type first extension diffusion layers 23A are formed in parts of the first active region 14A located under the first L-shaped sidewalls 17A. P-type pocket regions (not shown) are formed in parts of the first active region 14A located under the first extension diffusion layers 23A.

The second MIS transistor 12B is formed on a second active region 14B of the second area 11B isolated by a part of the isolation region 13 in the second area 11B. A second gate electrode 16B is formed on the second active region 14B with a second gate insulating film 15B interposed therebetween. Second L-shaped sidewalls 17B are formed to cover both lateral sides of the second gate electrode 16B and parts of the top surface of the semiconductor substrate 11 and each have an L-shaped cross-sectional shape. Outer sidewalls 18 are formed on the second L-shaped sidewalls 17B.

P-type second source/drain regions 22B are formed in parts of the second active region 14B located on both lateral sides of a part thereof covered with the second gate electrode 16B, the second L-shaped sidewalls 17B and the outer sidewalls 18. P-type second extension diffusion layers 23B are formed in parts of the second active region 14B located under the second L-shaped sidewalls 17B. N-type pocket regions (not shown) are formed in parts of the second active region 14B located under the second extension diffusion layers 23B.

Silicide layers 24 are formed in respective upper parts of the first and second gate electrodes 16A and 16B and respective upper parts of the first and second source/drain regions 22A and 22B.

A liner insulating film 25 is formed to entirely cover the semiconductor substrate 11 and the first and second MIS transistors 12A and 12B. In this embodiment, the liner insulating film 25 represents a film having tensile stress. The tensile stress represents stress pulling, along the gate length direction, a channel region through which electrons travel.

The first and second gate electrodes 16A and 16B are formed to cover not only respective parts of the first active regions 14A and 14B but also parts of the isolation region 13. Thus, a plurality of first gate electrodes 16A are formed on the first area 11A at fixed intervals w, and a plurality of second gate electrodes 16B are formed on the second area 11B at fixed intervals w.

The semiconductor device of this embodiment is configured in the following manner: When the thickness of each of the first and second L-shaped sidewalls 17A and 17B is t1, the thickness of each of the outer sidewalls 18 is t2, and the thickness of the liner insulating film 25 is t3, the relationship of $2\times(t1+t3)<w\leqq2\times(t1+t2+t3)$ is satisfied. For example, assume that when the interval w between each adjacent pair of electrodes is 150 nm, the thickness t1 of each of the first and second L-shaped sidewalls 17A and 17B is 10 nm, the thickness t2 of the outer sidewall 18 is 45 mn, and the thickness t3 of the liner insulating film 25 is 30 nm. In this case, for the first area 11A, a recess between each adjacent pair of the first gate electrodes 16A is partially left, and for the second area 11B, a recess between each adjacent pair of the second gate electrodes 16B is filled with the liner insulating film 25. In view of the above, the minimum thickness of a part of the liner insulating film 25 located on each of the second source/drain regions 22B becomes larger than that of a part thereof located on each of the first source/drain regions 22A. In other words, the top surface of a part of the liner insulating film 25 located on each of the first source/drain regions 22A and having the minimum thickness is below the top surface of the first gate electrode 16A. Meanwhile, the top surface of a part of the liner insulating film 25 located on each of the second source/drain regions 22B and having the minimum thickness is above the top surface of the second gate electrode 16B.

With the above-mentioned structure, the semiconductor device of the present invention can provide the following effects. First, since, for the first MIS transistor 12A, outer sidewalls are not formed on the first L-shaped sidewalls 17A, the liner insulating film 25 is in contact with the first L-shaped sidewalls 17A. Since the distance between the channel region under the first gate electrode 16A and the liner insulating film 25 therefore becomes small, tensile stress can be efficiently applied to the channel region of the first MIS transistor 12A along the gate length direction.

Meanwhile, for the second MIS transistor 12B, the outer sidewalls 18 are formed between the liner insulating film 25 and the second L-shaped sidewalls 17B. Since the distance between the channel region of the second MIS transistor 12B and the liner insulating film 25 therefore becomes large, tensile stress applied to the channel region of the second MIS transistor 12B along the gate length direction becomes small.

Furthermore, for the second area 11B, the recess between each adjacent pair of second gate electrodes 16B (the second gate electrode 16B on the second active region 14B and the adjacent second gate electrode 16B on the isolation region 13) is filled with the liner insulating film 25. Therefore, the liner insulating film 25 cannot pull the channel region of the second MIS transistor 12B so that stress is hardly applied to the channel region of the second MIS transistor 12B along the gate length direction.

As a result, tensile stress is applied to the N-type first MIS transistor 12A, thereby improving the driving force of the first MIS transistor 12A. However, tensile stress is not applied to the P-type second MIS transistor 12B, thereby restraining a reduction in the driving force of the second MIS transistor 12B.

Figure 2A:
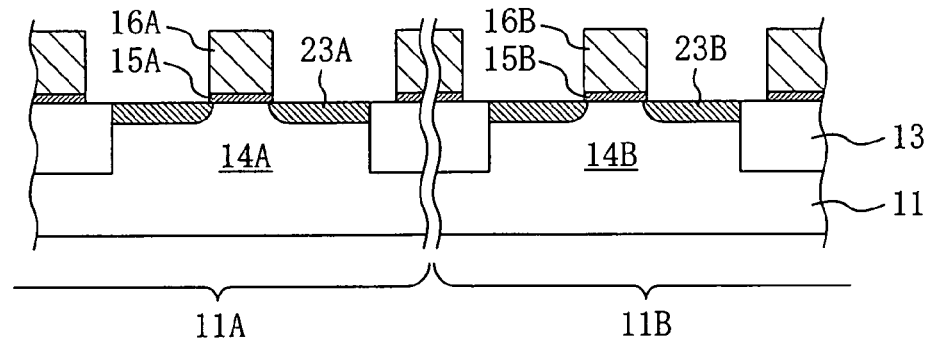
FIGS. 2A through 2C are cross-sectional views illustrating fabrication process steps for the semiconductor device according to the first embodiment of the present invention.

A fabrication method for a semiconductor device according to the first embodiment will be described hereinafter with reference to the drawings. FIGS. 2 and 3 illustrate fabrication process steps for a semiconductor device according to this embodiment step by step. First, as illustrated in FIG. 2A, an isolation region 13, such as a shallow trench isolation (STI) structure, is formed in a semiconductor substrate 11 made of Si. Then, a first active region 14A is formed in a first area 11A of the semiconductor substrate 11, and a second active region 14B is formed in a second area 11B thereof.

Subsequently, a silicon oxide film that will be gate insulating films and a polysilicon film that will be gate electrodes are deposited on the semiconductor substrate 11 and then selectively etched, thereby forming first gate insulating films 15A and first gate electrodes 16A on the first area 11A and forming second gate insulating films 15B and second gate electrodes 16B on the second area 11B. In this case, recesses between each adjacent pair of the first gate electrodes 16A and between each adjacent pair of the second gate electrodes 16B are set to each have a fixed width.

Thereafter, N-type impurity ions are implanted into the first active region 14A at a dose of $1\times10^{15}$ ions/cm$^2$ through $3\times10^{15}$ ions/cm$^2$ using the first gate electrodes 16A as a mask. In this manner, first extension diffusion layers 23A are formed in parts of the first active region 14A located to both lateral sides of each first gate electrode 16A to each have a depth of 100 nm or less. Then, pocket regions may be formed by implanting P-type impurity ions into parts of the first active region 14A located under the first extension diffusion layers 23A. Subsequently, P-type impurity ions are implanted into the second active region 14B at a dose of $1\times10^{15}$ ions/cm$^2$ through $3\times10^{15}$ ions/cm$^2$ using the second gate electrodes 16B as a mask. In this manner, second extension diffusion layers 23B are formed in parts of the second active region 14B located to both lateral sides of each second gate electrode 16B to each have a depth of 100 nm or less. Then, pocket regions may be formed by implanting N-type impurity ions into parts of the second active region 14B located under the second extension diffusion layers 23B.

Figure 2B:
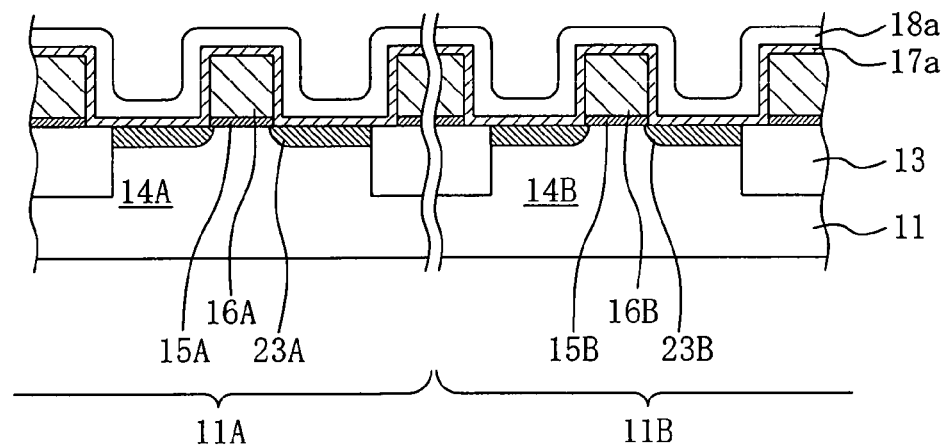

Next, as illustrated in FIG. 2B, a 10-nm-thick first insulating film 17a made of silicon dioxide (SiO$_2$) is formed to cover the semiconductor substrate 11 and the first and second gate electrodes 16A and 16B. Subsequently, a 30- through 50-nm-thick second insulating film 18a made of silicon nitride (SiN) is formed to cover the first insulating film 17a.

Figure 2C:
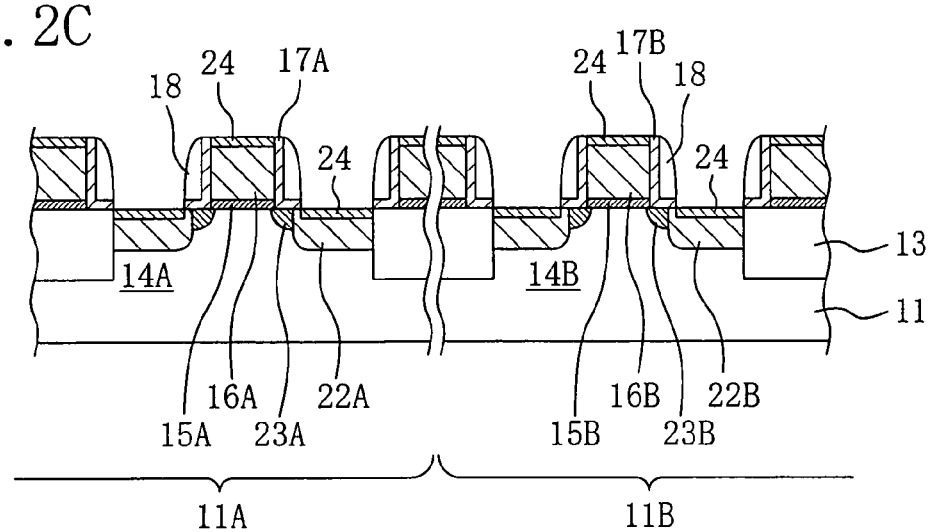

Next, as illustrated in FIG. 2C, the first and second insulating films 17a and 18a are subjected to anisotropic etching. In this manner, first L-shaped sidewalls 17A are formed to cover both lateral sides of the first gate electrodes 16A and regions of the semiconductor substrate 11 surrounding the first gate electrodes 16A, second L-shaped sidewalls 17B are formed to cover both lateral sides of the second gate electrodes 16B and regions of the semiconductor substrate 11 surrounding the second gate electrodes 16B, and outer sidewalls 18 are formed to cover the first and second L-shaped sidewalls 17A and 17B.

Subsequently, N-type impurity ions are implanted into the first active region 14A at a dose of $4\times10^{15}$ ions/cm$^2$ through $5\times10^{15}$ ions/cm$^2$ using the first gate electrodes 16A, the first L-shaped sidewalls 17A and the outer sidewalls 18 as masks, thereby forming first source/drain regions 22A. P-type impurity ions are implanted into the second active region 14B at a dose of $1\times10^{15}$ ions/cm$^2$ through $3\times10^{15}$ ions/cm$^2$ using the second gate electrodes 16B, the second L-shaped sidewalls 17B and the outer sidewalls 18 as masks, thereby forming second source/drain regions 22B. Thereafter, the semiconductor substrate 11 is subjected to heat treatment at temperatures of 1000 through 1100° C., thereby activating the impurity ions.

Subsequently, respective upper parts of the first and second gate electrodes 16A and 16B and respective upper parts of the first and second source/drain regions 22A and 22B are allowed to react with a refractory metal so as to be silicided, thereby forming silicide layers 24.

Figure 3A:
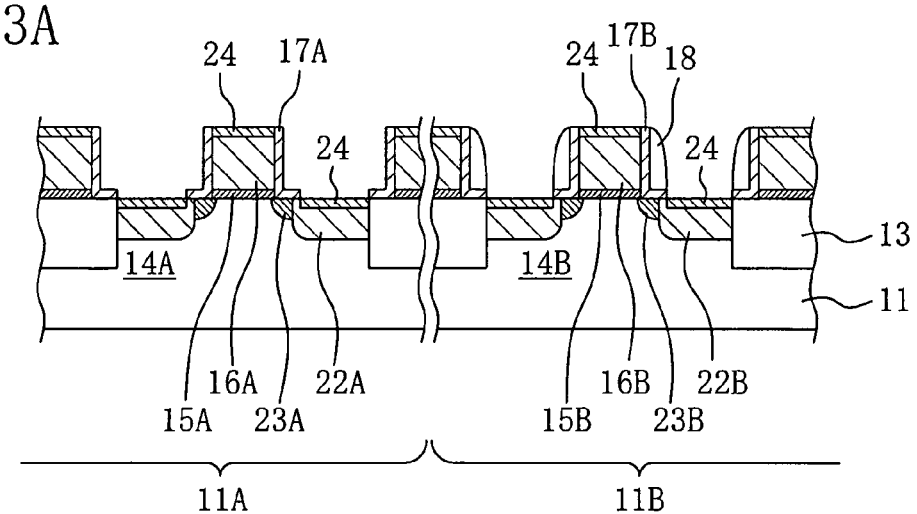
FIGS. 3A through 3C are cross-sectional views illustrating other fabrication process steps for the semiconductor device according to the first embodiment of the present invention.

Next, as illustrated in FIG. 3A, only the first area 11A is etched using a phosphate solution, thereby selectively removing the outer sidewalls 18 formed on the first L-shaped sidewalls 17A. Therefore, the width w1 of the recess between each adjacent pair of the first gate electrodes 16A is equal to w−2×t1, and the width w2 of the recess between each adjacent pair of the second gate electrodes 16B is equal to w−2 (t1+t2). Herein, w represents the interval between each adjacent pair of the first gate electrodes 16A or between each adjacent pair of the second gate electrodes 16B, t1 represents the thickness of each of the first and second L-shaped sidewalls 17A and 17B, and t2 represents the thickness of each outer sidewall 18.

Figure 3B:
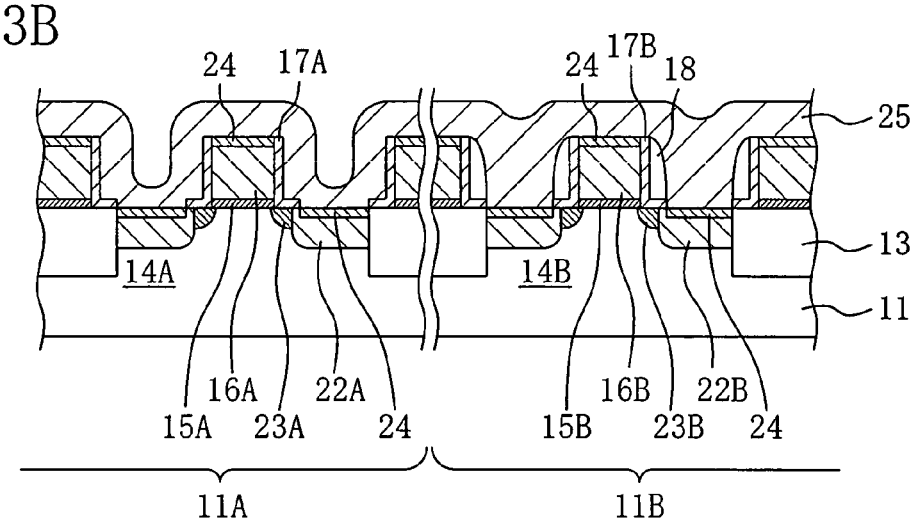

Next, as illustrated in FIG. 3B, a 30- through 50-nm-thick liner insulating film 25 made of SiN is formed to cover the semiconductor substrate 11 and the first and second gate electrodes 16A and 16B. In forming the liner insulating film 25, the conditions on which the liner insulating film 25 is deposited and other conditions are adjusted such that the liner insulating film 25 has tensile stress. The tensile stress represents stress pulling a channel region formed under the first gate electrode 16A along the gate length direction.

The thickness of the liner insulating film 25 is set such that the recess between each adjacent pair of the first gate electrodes 16A is partially left and the recess between each adjacent pair of the second gate electrodes 16B is filled. In other words, the thickness t3 of the liner insulating film 25 is set to satisfy $w2/2 \leq t3 \leq w1/2$.

Figure 3C:
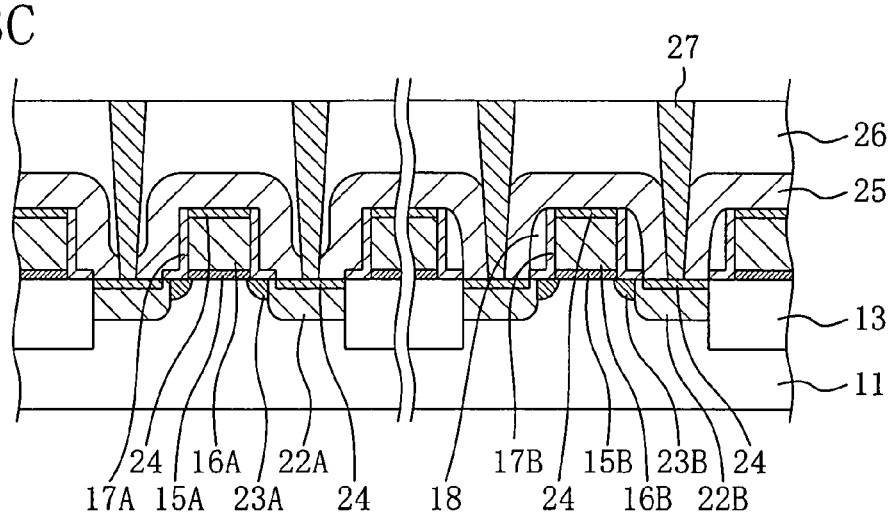

Next, as illustrated in FIG. 3C, an interlayer dielectric 26 made of $SiO_2$ is formed to cover the liner insulating film 25. Subsequently, contact holes are formed to pass through the interlayer dielectric 26 and the liner insulating film 25 and expose the silicide layers 24 associated with the first and second source/drain regions 22A and 22B and then filled with a conductive material, thereby forming contact plugs 27 each connected to an associated one of the first and second source/drain regions 22A and 22B. Furthermore, if necessary, plugs (not shown) may be formed so as to be electrically connected to the first and second gate electrodes 16A and 16B, respectively, and then an interconnect layer (not shown) may be formed.

In the semiconductor device of this embodiment, the first and second gate electrodes 16A and 16B are preferably placed such that the gate length direction of each of the first and second gate electrodes 16A and 16B (the direction along which current flows from an associated source region to an associated drain region) corresponds to the <100> crystal axis direction of the semiconductor substrate 11. The reason for this will be described below.

Figure 4:
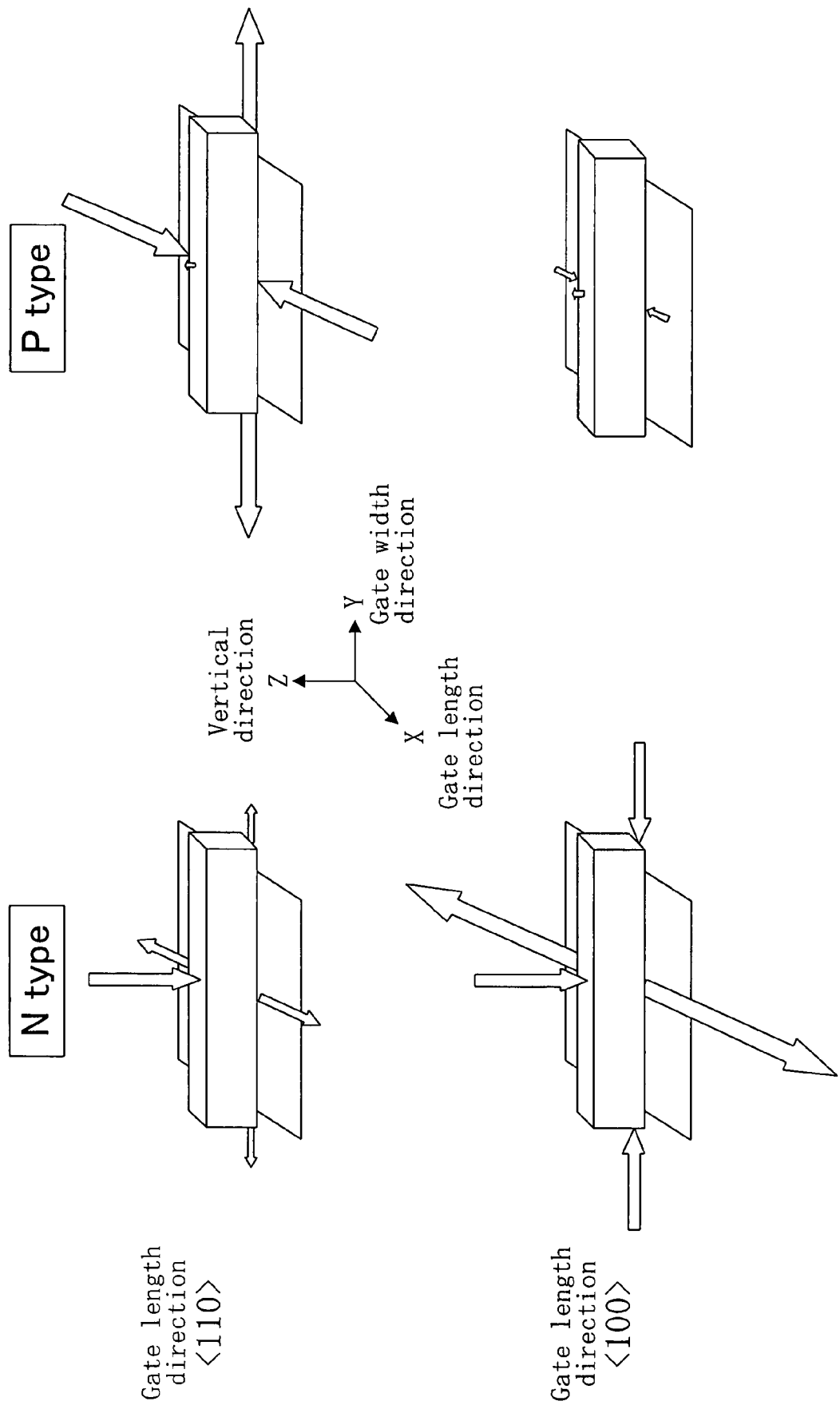
FIG. 4 is a diagram illustrating the correlation between stress and the effect of improving the driving force of the semiconductor device according to the first embodiment of the present invention.

FIG. 4 illustrates the direction of stress applied to a channel region of each of transistors by a liner insulating film and the magnitude of the effect of improving the driving force of the transistor by virtue of the stress. In FIG. 4, the directions of the arrows correspond to the directions of stresses, and the magnitude of each arrow corresponds to the magnitude of the effect of improving the driving force of the associated transistor.

As illustrated in FIG. 4, the driving force of an N-type transistor is improved by applying tensile stress to the associated channel region independently of whether the gate length direction thereof corresponds to the <110> crystal axis direction or the <100> crystal axis direction. When the gate length direction corresponds to the <100> crystal axis direction, the effect of improving the driving force is more significant than when the gate length direction corresponds to the <110> crystal axis direction. In view of the above, when the gate length direction of an N-type transistor is allowed to correspond to the <100> crystal axis direction, this can further increase the effect of improving the driving force of the N-type transistor by virtue of a liner insulating film.

On the other hand, the driving force of a P-type transistor is improved by applying compressive stress to the associated channel region independently of whether the gate length direction thereof corresponds to the <110> crystal axis direction or the <100> crystal axis direction. Therefore, when tensile stress is applied to a channel region of a P-type transistor, the driving force thereof is reduced. However, when the gate length direction corresponds to the <100> crystal axis direction, variations in the driving force of a P-type transistor due to stress are hardly caused. In view of the above, when the gate length direction of a P-type transistor is allowed to correspond to the <100> crystal axis direction, this hardly reduces the driving force of the P-type transistor even with a liner insulating film having tensile stress.

The semiconductor device of this embodiment is configured such that the recess between each adjacent pair of the second gate electrodes 16B is filled with the liner insulating film 25. Thus, stress from the liner insulating film 25 is hardly applied to the second MIS transistor 12B. Therefore, the gate length direction of the second gate electrode 16B does not always need to correspond to the <100> crystal axis direction.

In order to allow the gate length direction to correspond to the <100> crystal axis direction, the first and second gate electrodes 16A and 16B need to be patterned with a wafer rotated 45° as compared with the normal case where the gate length direction corresponds to the <110> crystal axis direction.

In this embodiment, a description was given of the case where the conductivity type of a first MIS transistor 12A is N, the conductivity type of a second MIS transistor 12B is P, and a liner insulating film 25 has tensile stress. Meanwhile, in a case where the conductivity type of the first MIS transistor 12A is P, the conductivity type of the second MIS transistor 12B is N, and the liner insulating film 25 has compressive stress, this can also provide the same effect. In this case, when compressive stress is applied to a channel region of the P-type MIS transistor along the gate length direction thereof, this improves the driving force thereof. Meanwhile, since compressive stress is hardly applied to a channel region of the N-type MIS transistor along the gate length direction thereof, this prevents the driving force thereof from being reduced. The compressive stress in this embodiment means stress compressing a channel region along the gate length direction.

Embodiment 2

Figure 5:
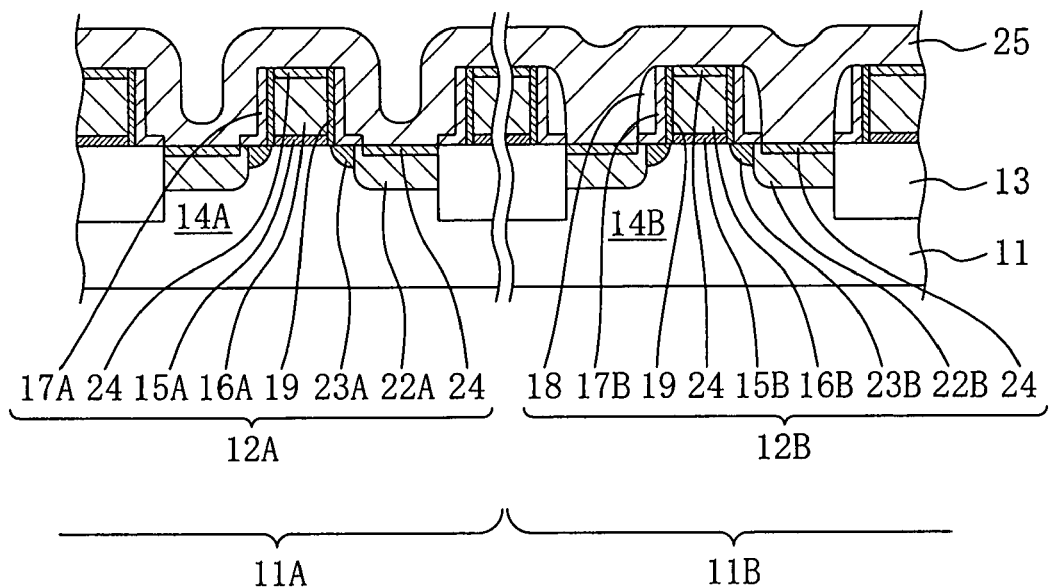
FIG. 5 is a cross-sectional view illustrating a semiconductor device according to a second embodiment of the present invention.
Figure 6:
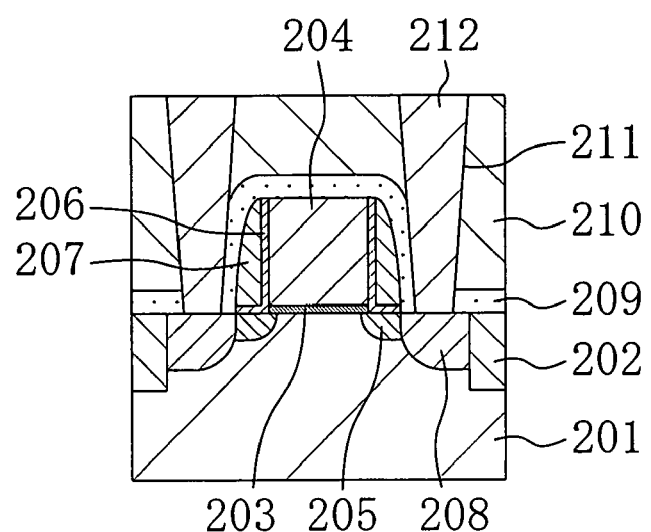
FIG. 6 is a cross-sectional view illustrating a semiconductor device according to a known example.

A second embodiment of the present invention will be described hereinafter with reference to the drawings. FIG. 5 illustrates a cross-sectional structure of a semiconductor device according to the second embodiment. In FIG. 5, the same components as in FIG. 1B are denoted by the same reference numerals as in FIG. 1B, and thus the descriptions thereof are omitted.

As illustrated in FIG. 5, a first MIS transistor 12A has I-shaped sidewalls 19 formed between an associated first gate electrode 16A and associated first L-shaped sidewalls 17A, and a second MIS transistor 12B has I-shaped sidewalls 19 formed between an associated second gate electrode 16B and associated second L-shaped sidewalls 17B. The I-shaped sidewalls 19 are made of, for example, 5- through 10-nm-thick $SiO_2$.

When the I-shaped sidewalls 19 are formed as described above, respective edge parts of the first and second gate electrodes 16A and 16B can be protected. This can restrain the leakage current from being generated from the edge parts of the first and second gate electrodes 16A and 16B.

In the first and second embodiments, a liner insulating film 25 having tensile stress or a liner insulating film 25 having compressive stress is formed by a known method. A SiN film containing hydrogen is formed, for example, by a plasma chemical vapor deposition (P-CVD) method, and then a SiN film having tensile stress can be obtained by removing hydrogen from the formed SiN film containing hydrogen using ultraviolet irradiation or any other method.

Furthermore, in the first and second embodiments, a description was given of the structure in which a first gate electrode 16A of another first MIS transistor adjacent to the first MIS transistor 12A and a second gate electrode 16B of another second MIS transistor adjacent to the second MIS transistor 12B cover also parts of the isolation region 13. However, components covering parts of the isolation region 13 do not always need to be the first and second gate electrodes 16A and 16B, and projections need only be formed to project outward. The projections may be formed of, for example, interconnects, dummy interconnects, or dummy electrodes. Alternatively, the projections may be a combination of interconnects, dummy interconnects and dummy electrodes. In this case, the liner insulating film 25 is formed in the following manner: The recess between the first gate electrode 16A on the first active region 14A and an adjacent one of the projections on the isolation region 13 is partially left, and the recess between the second gate electrode 16B on the second active region 14B and an adjacent one of the projections on the isolation region 13 is filled.

An example in which the interval between each adjacent pair of first gate electrodes is equal to the interval between each adjacent pair of second gate electrodes was described. However, as long as the recess between each adjacent pair of the first gate electrodes can be partially left and the recess between each adjacent pair of the second gate electrodes can be filled, the interval between each adjacent pair of the first gate electrodes may be different from the interval between each adjacent pair of the second gate electrodes.

In the first and second embodiments, silicide layers made of a reaction product of a refractory metal and silicon are formed in upper parts of the gate electrodes made of polysilicon. Alternatively, so-called fully silicided gate electrodes may be formed by siliciding the whole gate electrodes. Alternatively, the gate electrodes may be formed of metal films.

In the first and second embodiments, an example in which the gate insulating film also covers parts of the isolation region 13 was described. However, when a gate insulating film is formed by thermal oxidation or any other method, no gate insulating film covers parts of the isolation region 13. This structure has no problem. The gate insulating film is not limited to a silicon oxide film, and a high-dielectric-constant insulating film, such as a silicon oxynitride film, $HfO_2$, $HfSiO_2$, $HfSiON$, or $HfAlO_x$, may be used as the gate insulating film.

The semiconductor device of each of the first and second embodiments may be any kind of semiconductor device as long as it includes an N-type transistor and a P-type transistor. For example, it may be a static random access memory (SRAM).

As described above, the semiconductor device of the present invention allows stress from a liner insulating film to be sufficiently transferred to a channel region of a transistor, and the present invention can provide a semiconductor device which includes transistors of different conductivity types and in which the need for the step of removing a liner insulating film is eliminated.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
  a first MIS (metal-insulator semiconductor) transistor including:
    a first gate insulating film formed on a first area of a semiconductor substrate;
    a first gate electrode formed on the first gate insulating film;
    a first L-shaped sidewall covering a side of the first gate electrode and part of the semiconductor substrate to have an L-shaped cross-sectional shape; and
    a first source/drain region formed laterally outward of a part of the first area covered with the first gate electrode and the first L-shaped sidewall;
  a second MIS transistor including:
    a second gate insulating film formed on a second area of the semiconductor substrate;
    a second gate electrode formed on the second gate insulating film;
    a second L-shaped sidewall covering a side of the second gate electrode and part of the semiconductor substrate to have an L-shaped cross-sectional shape;
    a first outer sidewall formed on the second L-shaped sidewall; and
    a second source/drain region formed laterally outward of a part of the second area covered with the second gate electrode, the second L-shaped sidewall, and the first outer sidewall; and
  a liner insulating film covering the first MIS transistor and the second MIS transistor and applying stress to a channel region of the first MIS transistor along the gate length direction of the first gate electrode,
  wherein no outer sidewall is formed on the first L-shaped sidewall,
  the minimum thickness of a first part of the liner insulating film located on the first source/drain region in a direction vertical to a surface of the semiconductor substrate is less than the minimum thickness of a second part of the liner insulating film located on the second source/drain region in the direction vertical to the surface of the semiconductor substrate, and
  the second part is made of a same insulating material as the first part and is a single layer.

2. The semiconductor device of claim 1, wherein
  a top surface of a portion, having the minimum thickness, of the first part of the liner insulating film is below a top surface of the first gate electrode, and a top surface of a part of the liner insulating film located on the second source/drain region and having the minimum thickness is above a top surface of the second gate electrode.

3. The semiconductor device of claim 1 further comprising:
a first projection formed on an isolation region located on a side of the second source/drain region opposite to the second gate electrode; and
a third L-shaped sidewall and a second outer sidewall formed on a side of the first projection,
wherein a portion of the liner insulating film is formed on the second area to cover the first outer sidewall and the second outer sidewall and fill a recess between the second gate electrode and the first projection.

4. The semiconductor device of claim 3, wherein
the second L-shaped sidewall and the third L-shaped sidewall have a same thickness,
the first outer sidewall and the second outer sidewall have a same thickness, and
an interval between the second gate electrode and the first projection is equal to or smaller than twice the sum of the thickness of the second L-shaped sidewall, the thickness of the first outer sidewall and a thickness of the liner insulating film.

5. The semiconductor device of claim 3, wherein
the second MIS transistor comprises a plurality of second MIS transistors, and
the first projection is a second gate electrode of one of the second MIS transistors.

6. The semiconductor device of claim 3, wherein the first projection is one of an interconnect, a dummy interconnect, and a dummy electrode.

7. The semiconductor device of claim 3 further comprising:
a second projection formed on an isolation region located on a side of the first source/drain region opposite to the first gate electrode; and
a fourth L-shaped sidewall formed on a side of the second projection,
wherein an other portion of the liner insulating film is formed on the first area to be in contact with the first L-shaped sidewall and the fourth L-shaped sidewall and extends along a surface of a recess between the first gate electrode and the second projection with a part of the recess maintained.

8. The semiconductor device of claim 7, wherein
the first L-shaped sidewall and the fourth L-shaped sidewall have a same thickness, and
an interval between the first gate electrode and the second projection is larger than twice the sum of the thickness of the first L-shaped sidewall and a thickness of the liner insulating film.

9. The semiconductor device of claim 7, wherein
the first MIS transistor comprises a plurality of first MIS transistors, and
the second projection is a first gate electrode of one of the first MIS transistors.

10. The semiconductor device of claim 7, wherein the second projection is one of an interconnect, a dummy interconnect, and a dummy electrode.

11. The semiconductor device of claim 7, wherein
an interval between the first gate electrode and the second projection is equal to an interval between the second gate electrode and the first projection, and
the first L-shaped sidewall, the second L-shaped sidewall, the third L-shaped sidewall, and the fourth L-shaped sidewall have a same thickness.

12. The semiconductor device of claim 1, wherein
the first MIS transistor is an N-type MIS transistor,
the second MIS transistor is a P-type MIS transistor, and
the liner insulating film is a film applying tensile stress along the gate length direction of the first gate electrode.

13. The semiconductor device of claim 1, wherein
the semiconductor substrate is made of silicon, and
the gate length direction of each of the first and second gate electrodes is along the <100> crystal axis direction of the semiconductor substrate.

14. The semiconductor device of claim 1, wherein
the first MIS transistor includes a first I-shaped sidewall formed between the first gate electrode and the first L-shaped sidewall to have a plate-like cross-sectional shape, and
the second MIS transistor includes a second I-shaped sidewall formed between the second gate electrode and the second L-shaped sidewall to have a plate-like cross-sectional shape.

15. The semiconductor device of claim 1, wherein
the first MIS transistor includes a first extension diffusion layer formed in a portion of the first area located under the first L-shaped sidewall, and
the second MIS transistor includes a second extension diffusion layer formed in a portion of the second area located under the second L-shaped sidewall.

16. The semiconductor device of claim 1 further comprising
an interlayer dielectric covering the liner insulating film; and
contact plugs passing through the interlayer dielectric and electrically connected to the first source/drain region and the second source/drain region.

17. The semiconductor device of claim 1, wherein the first and second MIS transistors are transistors each forming a part of a static random access memory.

18. The semiconductor device of claim 1, wherein a portion of the liner insulating film formed on the first gate electrode has a same thickness as a portion of the liner insulating film formed on the second gate electrode.

* * * * *